United States Patent
Kolman et al.

[11] Patent Number: 5,699,227
[45] Date of Patent: Dec. 16, 1997

[54] HEAT PIPE TO BASEPLATE ATTACHMENT METHOD

[75] Inventors: Frank Kolman, Phoenix; Michael Brownell; Hong Xie, both of Chandler, all of Ariz.

[73] Assignee: Intel Corporation, Santa Clara, Calif.

[21] Appl. No.: 671,666

[22] Filed: Jun. 28, 1996

[51] Int. Cl.[6] .................................................. H05K 7/20
[52] U.S. Cl. .............. 361/700; 29/890.032; 165/104.33; 361/719; 257/714
[58] Field of Search ................ 29/890.032; 361/687, 361/699, 700, 702, 717–719, 722; 257/212, 713, 706, 707, 714; 124/15.2; 62/259.2; 165/80.3, 80.4, 104.33, 185

[56] References Cited

U.S. PATENT DOCUMENTS

| | | | |
|---|---|---|---|
| 5,095,404 | 3/1992 | Chao | 361/385 |
| 5,162,974 | 11/1992 | Currie | 361/385 |
| 5,412,535 | 5/1995 | Chao | 361/700 |

OTHER PUBLICATIONS

"Cooling Device—Modules", Clark, IBM Tech Discl Bull vol. 20 No. 5 Oct. 1977, pp. 1769–1771.

*Primary Examiner*—Gerald P. Tolin
*Attorney, Agent, or Firm*—Blakely, Sokoloff, Taylor & Zafman

[57] ABSTRACT

An integrated circuit package which has a heat pipe that is incorporated into the body of the package. The package contains an integrated circuit which is mounted to a package substrate. The integrated circuit die is enclosed by a cover plate that is attached to the substrate. The heat pipe is attached to a nut that is screwed into the cover plate. The heat pipe has a bottom surface that is thermally coupled to the die to provide a direct thermal path between the integrated circuit and the heat pipe.

15 Claims, 1 Drawing Sheet

HEAT PIPE TO BASEPLATE ATTACHMENT METHOD

BACKGROUND OF THE INVENTION

1. Field of the Invention

The present invention relates to an integrated circuit package.

2. Description of Related Art

Integrated circuits are typically housed within a package that is soldered to a printed circuit board. The integrated circuit generates heat which is typically removed from the package by an external fan. The packages are typically constructed from a ceramic or plastic material which has a relatively low thermal coefficient of conductivity. The high thermal impedance of the package produces an undesirable temperature differential between the ambient air and the junction temperatures of the integrated circuit.

Highly functional integrated circuits such as microprocessors generate a large amount of heat which must be removed while maintaining the junction temperatures of the circuit below a critical value. Some packages incorporate a heat slug which is thermally coupled to the die and exposed to the ambient. The heat slug provide a relatively low thermal impedance path from the die to the ambient to minimize the junction temperatures of the integrated circuit.

The heat transfer rate from the die is proportional to the outer surface area of the heat slug. The outer surface of the heat slug is limited by the size of the package. One approach to maintaining the junction temperature of the integrated circuit is to increase the size of the heat slug and the package. Increasing the size of the package is generally undesirable, because a larger package occupies valuable board space. To effectively cool devices which generate a large amount of heat it would be desirable to provide a package that is more thermally efficient than packages of the prior art.

SUMMARY OF THE INVENTION

The present invention is an integrated circuit package which has a heat pipe that is incorporated into the body of the package. The package contains an integrated circuit which is mounted to a package substrate. The integrated circuit die is enclosed by a cover plate that is attached to the substrate. The heat pipe is attached to a nut that is screwed into the cover plate. The heat pipe has a bottom surface that is thermally coupled to the die to provide a direct thermal path between the integrated circuit and the heat pipe.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
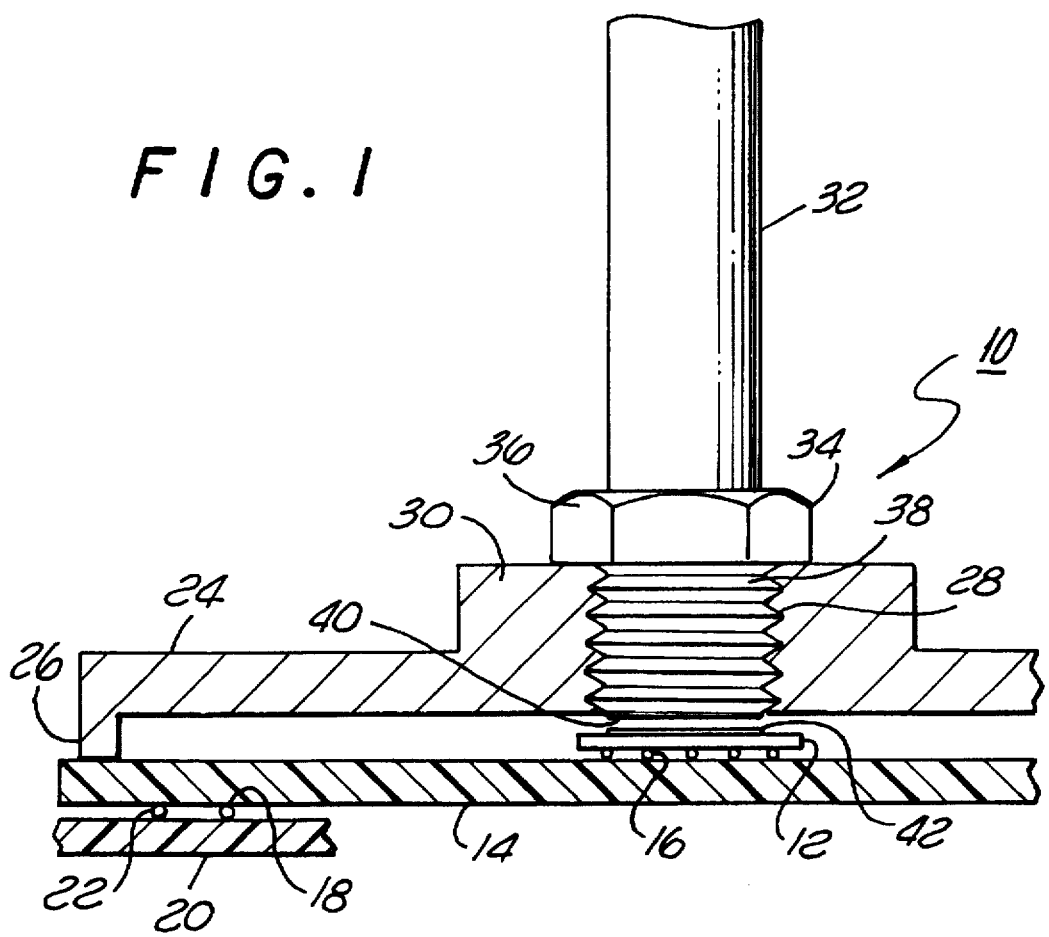
FIG. 1 is a cross-sectional view of a package of the present invention mounted to a printed circuit board.
Figure 2:
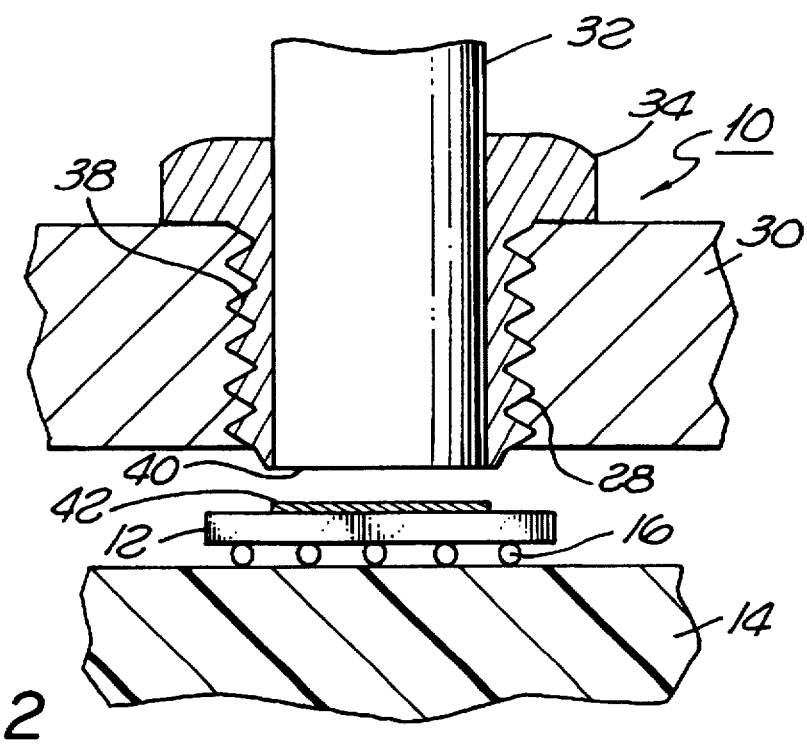
FIG. 2 is an enlarged cross-sectional view showing a heat pipe that is coupled to a cover plate of the package by a nut.

Referring to the drawings more particularly by reference numbers, FIGS. 1 and 2 show an integrated circuit package 10 of the present invention. The package 10 contains an integrated circuit die 12. The integrated circuit 12 may be a microprocessor. Although an integrated circuit is shown and described, it is to be understood that the package 10 may contain any electrical device.

The die 12 is mounted to a substrate 14 of the package. The die 12 may have solder bumps 16 that couple the integrated circuit to the substrate 14 with a process that is commonly referred to as "C4" or "flip chip" packaging. The substrate 14 typically contains internal routing layers and vias that couple the integrated circuit 12 to external pads 18 of the package. The external pads 18 are typically attached to a printed circuit board 20 by solder joints 22.

The integrated circuit 12 is enclosed by a cover plate 24. The cover plate 24 may be attached to the substrate 14 by an adhesive applied to an outer rim 26 of the plate 24. Alternatively, the cover plate 24 may be attached to the substrate 14 by fasteners (not shown). The cover plate 24 has a threaded aperture 28 located at the center of the package 10. The center portion 30 of the cover plate 24 preferably contains a raised portion which increases the number of threads that can be tapped into the plate 24. The cover plate 24 is preferably constructed from a metal material that can be readily threaded and which has a relatively high thermal coefficient of conductivity.

The package includes a heat pipe 32 that is attached to a nut 34. The nut 34 has a hex portion 36, and a threaded portion 38 that is screwed into the threaded aperture 28 of the cover plate 24. The heat pipe 32 has a bottom surface 40 that is thermally coupled to the integrated circuit 12. In the preferred embodiment, the package 10 contains a layer of thermal grease 42 located between the bottom surface 40 of the heat pipe 34 and the top surface of the die 12. The bottom surface 40 typically extends below the inside surface of the cover plate 24 to insure a direct thermal coupling between the die 12 and the heat pipe 32

The heat pipe 32 can be bonded to the nut 34 with a thermally conductive epoxy or other type of adhesive. Alternatively, the heat pipe 32 can be brazed to the nut 34. The nut 34 may be constructed from a material such as brass. The outer shell of the heat pipe 32 is typically constructed from copper.

The heat pipe 32 typically includes an outer metal cylinder which contains an internal wick (not shown) and a fluid which efficiently remove heat generated by the integrated circuit 12. The package of the present invention is particularly effective in cooling large devices such as microprocessors which generate a relatively large amount of heat. The nut 34 provides a means to readily couple the heat pipe 32 directly to the die 12. Additionally, the nut 34 can be turned to vary the distance that the heat pipe 32 extends from the cover plate 24. Moving the heat pipe 32 will allow a manufacturer to compensate for tolerances that vary the space between the cover plate 24 and the die 12. The nut 34 also allows the heat pipe 32 to be removed or repaired. A plug (not shown) could be inserted into the threaded aperture 28 for a package without a heat pipe 32.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package, comprising:

a substrate;

an integrated circuit mounted to said substrate;

a cover plate that encloses said integrated circuit;

a nut that is attached to said cover plate; and, a heat pipe that is attached to said nut and thermally coupled to said integrated circuit.

2. The package as recited in claim 1, further comprising a layer of thermal grease located between said heat pipe and said integrated circuit.

3. The package as recited in claim 1, wherein said nut has a thread that is screwed into a corresponding thread of said cover plate.

4. The package as recited in claim 1, wherein said heat pipe is bonded to said nut.

5. The package as recited in claim 1, wherein said heat pipe is brazed to said nut.

6. The package as recited in claim 1, wherein said heat pipe extends below a lower surface of said cover plate.

7. A printed circuit board assembly, comprising:

a printed circuit board;

a substrate mounted to said printed circuit board;

an integrated circuit mounted to said substrate;

a cover plate that encloses said integrated circuit;

a nut that is attached to said cover plate; and, a heat pipe that is attached to said nut and thermally coupled to said integrated circuit.

8. The assembly as recited in claim 7, further comprising a layer of thermal grease located between said nut and said integrated circuit.

9. The assembly as recited in claim 7, wherein said nut has a thread that is screwed into a corresponding thread of said cover plate.

10. The assembly as recited in claim 7, wherein said heat pipe is bonded to said nut.

11. The assembly as recited in claim 7, wherein said heat pipe is brazed to said nut.

12. The assembly as recited in claim 7, wherein said heat pipe extends below a lower surface of said cover plate.

13. A method for assembling an integrated circuit package, comprising the steps of:

a) mounting an integrated circuit to a substrate;

b) attaching a heat pipe to a nut;

c) screwing said nut into a cover plate; and, d) attaching said cover plate to said substrate so that said heat pipe is thermally coupled to said integrated circuit.

14. The method as recited in claim 13, further comprising the step of applying a layer of thermal grease to said integrated circuit before said cover plate is attached to said substrate.

15. The method as recited in claim 13, wherein said nut is screwed into said cover plate after said cover plate is attached to said base plate.

* * * * *